US007313040B2

(12) United States Patent
Huang et al.

(10) Patent No.: US 7,313,040 B2
(45) Date of Patent: Dec. 25, 2007

(54) DYNAMIC SENSE AMPLIFIER FOR SRAM

(75) Inventors: Mu-Hsiang Huang, San Jose, CA (US); Jae-Hyeong Kim, San Ramon, CA (US); Patrick T. Chuang, Cupertino, CA (US)

(73) Assignees: Sony Corporation, Tokyo (JP); Sony Electronics, Inc., Park Ridge, NJ (US)

( * ) Notice: Subject to any disclaimer, the term of this patent is extended or adjusted under 35 U.S.C. 154(b) by 0 days.

(21) Appl. No.: 11/417,805

(22) Filed: May 3, 2006

(65) Prior Publication Data

US 2007/0097765 A1 May 3, 2007

Related U.S. Application Data

(60) Provisional application No. 60/731,396, filed on Oct. 28, 2005.

(51) Int. Cl.
*G11C 7/00* (2006.01)

(52) U.S. Cl. ...................................... 365/205; 365/207

(58) Field of Classification Search ................ 365/205, 365/207, 208, 203

See application file for complete search history.

(56) References Cited

U.S. PATENT DOCUMENTS 4,370,737 A 1/1983 Chan .......................... 365/203
4,533,843 A * 8/1985 McAlexander et al. ....... 327/57
4,780,850 A * 10/1988 Miyamoto et al. ..... 365/189.09
4,991,141 A 2/1991 Tran .......................... 365/207
5,126,974 A * 6/1992 Sasaki et al. ............... 365/207
5,640,356 A 6/1997 Gibbs ......................... 365/207
5,706,236 A 1/1998 Yamamoto .................. 365/205
5,963,495 A * 10/1999 Kumar ....................... 365/207
6,088,278 A * 7/2000 Porter et al. ................ 365/208

OTHER PUBLICATIONS

Hong- Yi Huang et al., Self-Isolated Gain-Enhanced Sense Amplifier, VLSI/CAD Laboratory, Department of Electronic Engineering, Fu-Jen University and Integrated Circuits and Systems Laboratory, Institute of Electronics, National Chiao-Tung University, Taiwan.

Igor Arsovski, High-Speed Low-Power Sense Amplifier Design, ECE1352—Analog Electronics Reading Assignment, Nov. 12, 2001, pp. 1-14.

* cited by examiner

*Primary Examiner*—Vu A. Le
(74) *Attorney, Agent, or Firm*—Haverstock & Owens LLP

(57) ABSTRACT

A dynamic sense amplifier for static random access memory (SRAM) is provided. The dynamic sense amplifier includes a pre-amplifier configured to amplify small input signals according to a first clock signal, and a main sense-latch coupled to the pre-amplifier, wherein the main sense-latch is configured to respond to the small input signals according to a second clock signal and a third clock signal, and wherein the dynamic sense amplifier is configured to consume substantially zero direct current power.

29 Claims, 2 Drawing Sheets

DYNAMIC SENSE AMPLIFIER FOR SRAM

RELATED APPLICATIONS

This patent application claims priority under 35 U.S.C. 119(e) of the co-pending U.S. Provisional Pat. App. No. 60,731,396, filed Oct. 28, 2005 and entitled "DYNAMIC SENSE AMPLIFIER FOR SRAM." U.S. Provisional Pat. App. No. 60,731,396, filed Oct. 28, 2005 and entitled "DYNAMIC SENSE AMPLIFIER FOR SRAM," is also hereby incorporated by reference.

FIELD OF THE INVENTION

The present invention relates to static random access memory (SRAM). More particularly, the present invention relates to reducing power consumption of SRAM.

BACKGROUND OF THE INVENTION

Semiconductor devices comprise arrays of memory cells, which are arranged in rows and columns. The memory cells in the same row are switched on and off by word lines. The memory cells in a same column share a pair of bit lines. After the word line fires, the complementary bit lines develop small differential voltage during the read operation. For high-density memory design, small cell size is preferred and usually hundreds of cells are coupled to the same bit lines. Only one cell per bit line is turned on to provide discharging current. This slow discharging process is the main speed limitation for memory read operation. Conventional static sense amplifiers amplify whatever signals are transferred from the bit lines. The time required for the output voltage to reach rail-to-rail voltage level depends on the gain of the sense amplifier and output loading.

FIG. 1 illustrates a circuit diagram of a conventional sense amplifier 101. The sense amplifier 101 includes two positive channel metal oxide semiconductor (PMOS) devices P1 and P2. The PMOS transistors P1 and P2 each have a source coupled to the voltage Vdd and a drain coupled to one of the complementary output nodes, OUT and OUTB. The drain of the PMOS transistor P1 is coupled to the output node OUTB. The drain of the PMOS transistor P2 is coupled to the output node OUT. The PMOS transistors P1 and P2 each have a gate coupled to each other and to ground. The PMOS transistors P1 and P2 each behave like a load device. The inputs of the sense amplifier 101 are coupled to the gate of two negative channel metal oxide semiconductor (NMOS) devices N1 and N2. The gate of the NMOS transistor N1 is coupled to receive the input signal IN. The gate of the NMOS transistor N2 is coupled to receive the input signal INB. The drains of the input transistors N1 and N2 are coupled to the drains of the PMOS transistors P1 and P2, respectively, forming the output nodes OUTB and OUT. The sources of the NMOS transistors N1 and N2 are coupled to each other and to ground through a current source CS.

When the voltage level of the input signal IN is higher than the voltage of the input signal INB, the current I1 flowing through the drains of the transistors P1 and N1 will be higher than the current I2 flowing through the drains of the transistors P2 and N2. The PMOS transistors P1 and P2 are of the same size and under the same gate bias. Accordingly, the PMOS transistors P1 and P2 have approximately the same impedance. Accordingly, the voltage level at the output node OUT will be higher than the voltage level at the output node OUTB. This sense amplifier 101 needs to operate at a voltage level Vdd, where the voltage level Vdd must be greater than the PMOS threshold voltage level Vthp plus the NMOS threshold voltage level Vthn, in order for the sense amplifier 101 to function properly. Also, the sense amplifier 101 input will see bigger capacitive loading compared with a dynamic sense.

Unfortunately, a conventional static pre-amplifier consumes an undue amount of direct current (DC) power while the sense amplifier waits for sufficient input splits.

SUMMARY OF THE INVENTION

What is needed is an improved system having features for addressing the problems mentioned above and new features not yet discussed. Broadly speaking, the dynamic sense amplifier fills these needs by providing a dynamic sense amplifier for static random access memory (SRAM). It should be appreciated that the present invention can be implemented in numerous ways, including as a method, a process, an apparatus, a system or a device. Inventive embodiments of the present invention are summarized below.

In one embodiment, a dynamic sense amplifier comprises a pre-amplifier configured to amplify small input signals according to a first clock, and a main sense-latch coupled to the pre-amplifier, wherein the main sense-latch is configured to respond to the small input signals according to a second clock and a third clock, and wherein the dynamic sense amplifier is configured to consume substantially zero direct current power.

In another embodiment, a dynamic sense amplifier comprises a first pre-charger, a first equalizer coupled to the first pre-charger, a first pre-amplifier coupled to the first equalizer, a second pre-charger couple to the first pre-amplifier, a second equalizer coupled to the second pre-charger, and a main sense-latch coupled to the second equalizer.

In still another embodiment, a static random access memory comprises a dynamic sense amplifier, wherein the dynamic sense amplifier includes a pre-amplifier configured to amplify small input signals according to a first clock and a main sense-latch coupled to the pre-amplifier, and wherein the main sense-latch is configured to respond to the small input signals according to a second clock and a third clock, and wherein the dynamic sense amplifier is configured to consume substantially zero direct current power.

The invention encompasses other embodiments configured as set forth above and with other features and alternatives.

BRIEF DESCRIPTION OF THE DRAWINGS

The present invention will be readily understood by the following detailed description in conjunction with the accompanying drawings. To facilitate this description, like reference numerals designate like structural elements.

DETAILED DESCRIPTION OF THE PREFERRED EMBODIMENT(S)

A dynamic sense amplifier for static random access memory (SRAM) is disclosed. Numerous specific details are set forth in order to provide a thorough understanding of the present invention. It will be understood, however, to one skilled in the art, that the present invention may be practiced with other specific details.

Overview of Dynamic Sense Amplifier

An important objective here is to amplify a data signal read from memory cells. Accordingly, a dynamic sense amplifier is provided that includes a cross-coupled pre-amplifier and a differential sense-latch stage. The pre-amplifier amplifies small input signals. The sense-latch responds to these signals. The sensing time is shortened due to stronger splits of input signals. The sense amplifier consumes substantially no DC power because of its dynamic nature. Three stages of clock control improve the sensing speed and power consumption.

The pre-amplifier amplifies the input simultaneously with the sense-latch stage of the sense amplifier. More differential input voltage produces stronger output splits, thereby expediting the sensing process. After the readout data is stored in the latches L1 and L2, the pre-amplifier is shut off and the inputs get pre-charged so that the sense amplifier is ready for the next read operation. This multiple clocking scheme makes the sense amplifier particularly suitable for static random access memory having a high-speed pipeline design. The dynamic design of the sense amplifier consumes substantially no DC power. Thus, there is a significant power reduction for wide parallel data output applications.

Illustrative Embodiment

Figure 1:
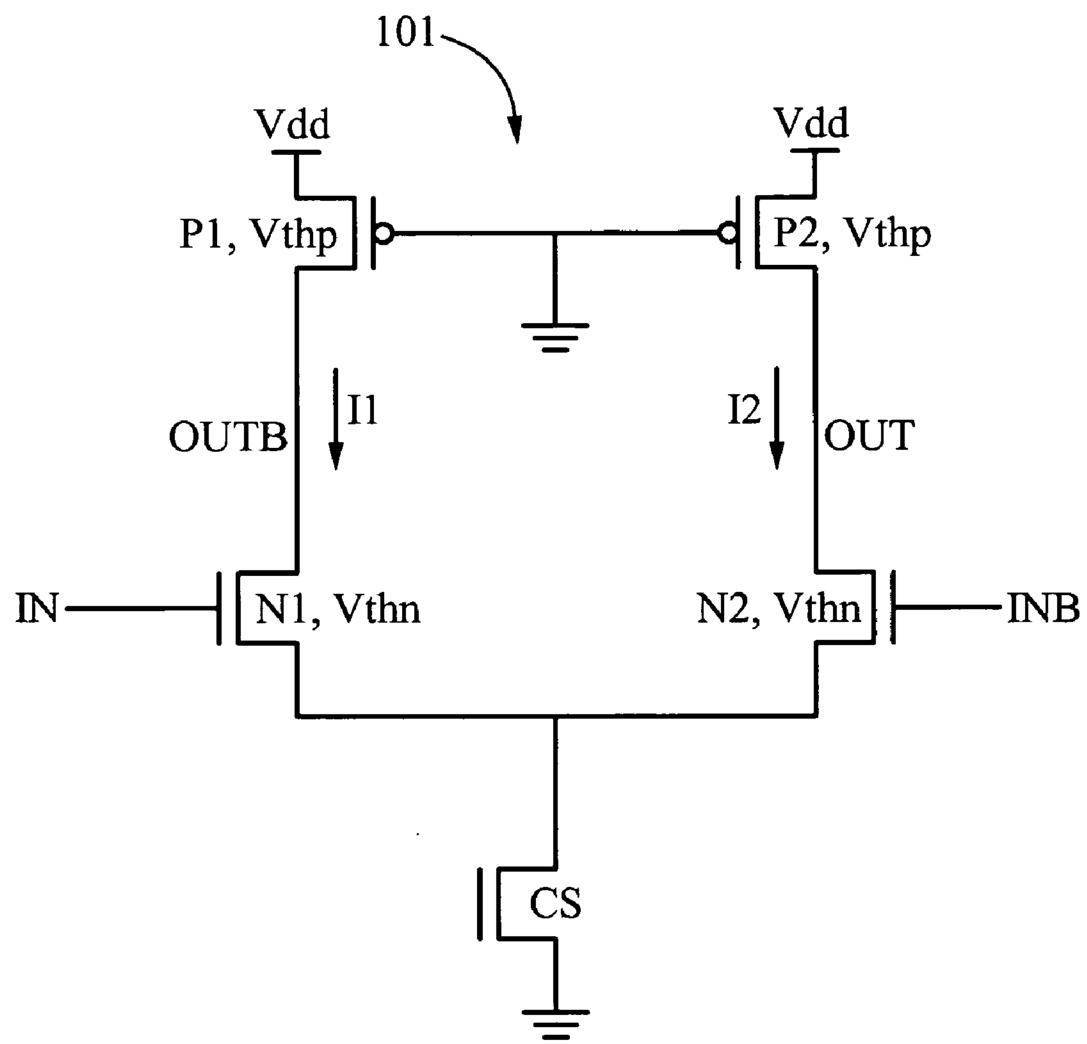
FIG. 1 illustrates a circuit diagram of a conventional sense amplifier.
Figure 2:
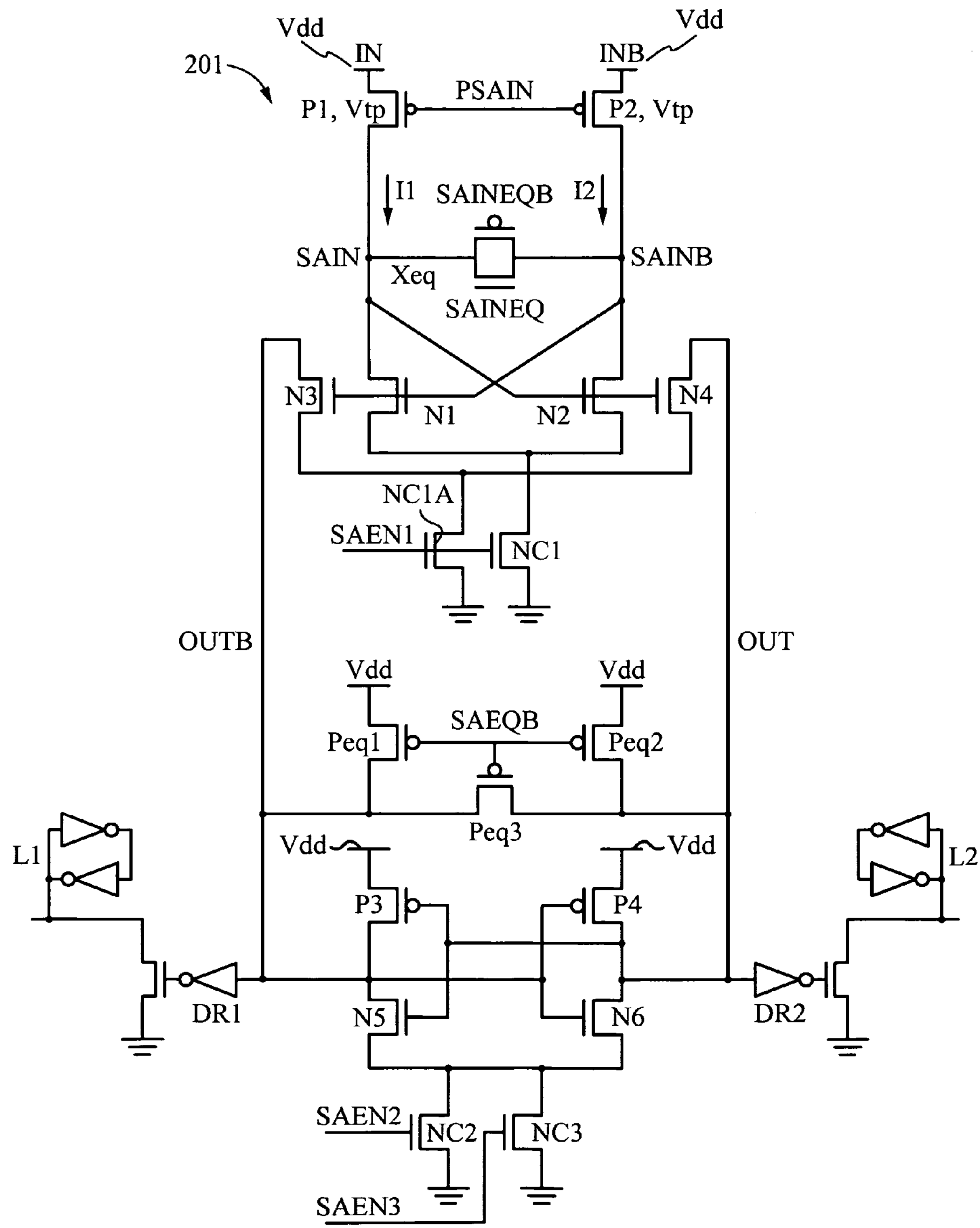
FIG. 2 is a circuit diagram of a dynamic sense amplifier for SRAM, in accordance with an embodiment of the present invention.

FIG. 2 is a circuit diagram of a dynamic sense amplifier 201 for SRAM, in accordance with some embodiments. A pre-charger stage includes the PMOS transistors P1 and P2 configured as switches. The PMOS transistors P1 and P2 each have a source node coupled to the input bit lines IN and INB, respectively. The PMOS transistors P1 and P2 each have a gate node coupled to each other and controlled by the pre-charge signal input PSAIN. The PMOS transistors P1 and P2 each have a drain node coupled to the sense amplifier input lines SAIN and SAINB, respectively, which are pre-charged to the voltage Vdd via the PMOS transistors P1 and P2 also.

An equalizer stage includes a PMOS transistor SAINEQB and a NMOS transistor SAINEQ. The equalizer forms a pass gate Xeq coupling the two sense amplifier input lines SAIN and SAINB after a read operation is complete.

A pre-amplifier stage includes the NMOS transistors N1 and N2. The two cross-coupled NMOS transistors N1 and N2 have their gates and drains coupled to the sense amplifier input lines. Specifically, the gate of the NMOS transistor N1 is coupled to the drains of the PMOS transistor P2 and the NMOS transistor N2. The gate of the NMOS transistor N2 is coupled to the drains of the PMOS transistor P1 and the NMOS transistor N1. The sources of the NMOS transistors N1 and N2 are coupled together and to a current source NC1. The pre-amplifier, including the NMOS transistors N1 and N2, is enabled when the current source NC1 is turned on.

The dynamic sense amplifier 201 does not use MOS transistors as load devices. Accordingly, the PMOS transistors P1 and P2 do not need to operate in their saturation regions. Thus, the dynamic sense amplifier 201 operates under very low power supply, preferably about 0.6 V.

A differential repeater pair includes the NMOS transistors N3 and N4. The differential repeater pair, including the NMOS transistors N3 and N4, have their gates coupled to the sense amplifier input lines SAINB and SAIN, respectively. However, the NMOS transistors N3 and N4 do not use the PMOS pair, including PMOS transistors P1 and P2, as their load device. The differential repeater pair discharges the capacitance of the NMOS transistors N3 and N4 onto the differential pair's output lines OUTB and OUT, respectively. These discharges onto the out lines OUTB and OUT occur at different rates in order to develop a differential voltage in the dynamic sense amplifier 201.

A pre-charger and equalizer for the main sense-latch includes three PMOS transistors Peq1, Peq2 and Peq3. The PMOS transistors Peq1 and Peq2 each have a source coupled to the voltage Vdd and a drain coupled to the output lines OUTB and OUT, respectively. The PMOS transistor Peq3 has a source coupled to the output line OUT and a drain coupled to the output line OUTB. The gates of the PMOS transistors Peq1, Peq2 and Peq3 are cross-coupled via a common node and controlled by the signal SAEQB. During equalization mode, the PMOS transistor Peq3 serves as an equalizer for the main sense latch. The PMOS transistor Peq3 is an equalizer that couples the two complementary output lines OUT and OUTB after a read operation in order to substantially eliminate a voltage difference between the voltage at the output line OUT and the voltage at the output line OUTB.

A main sense-latch includes the two cross-coupled PMOS transistors P3 and P4 and the two cross-coupled NMOS transistors N5 and N6. The PMOS transistors P3 and P4 each have a source coupled to the voltage Vdd. Coupled at a node are the drain of the PMOS transistor P3, the drain of the NMOS transistor N5, the gate of the PMOS transistor P4, the gate of the NMOS transistor N6, the output line OUTB and an input of the output driver DR1. Coupled at another node are the drain of the PMOS transistor P4, the drain of the NMOS transistor N6, the gate of the PMOS transistor P3, the gate of the NMOS transistor N5, the output line OUT and an input of the output driver DR2: The sources of the NMOS transistor N5 and the NMOS transistor N6 are coupled together and to the current sources NC2 and NC3. Preferably, the current NC3 provides more current than the current source NC2 in order to speed up the output splitting of the voltage at the output line OUT from the voltage at the output line OUTB. The current sources NC1, NC2 and NC3 are controlled by the clock signals SAEN1, SAEN2 and SAEN3, respectively.

More Details of the Illustrative Embodiment

The dynamic sense amplifier 201 can be analyzed in stages or blocks, including pre-chargers, equalizers, a pre-amplifier, current sources and a main sense-latch. The interconnections of these devices are discussed above with reference to FIG. 2. This section is directed toward providing more details about the operation of these devices.

Before the dynamic sense amplifier 201 starts a read operation, the pre-charge and equalization circuitry keeps all the internal nodes pre-charged at the voltage level Vdd. This pre-charge and equalization circuitry of the dynamic sense amplifier 201 includes the PMOS transistors P1 and P2, the PMOS transistor SAINEQB, the NMOS transistor SAINEQ and the PMOS transistors Peq1, Peq2 and Peq3.

When the read operation begins, the equalizer transistor SAINEQ turns off and the memory cell, including the NMOS transistors N1, N2, N3 and N4, slowly discharges a current of the input bit lines IN and INB. This discharging occurs via the differential repeater, which includes the NMOS transistors N3 and N4. During this stage, the PMOS transistor pair P1 and P2 serves as a switch to conduct the slight differential voltage to the sense amplifier inputs SAIN and SAINB. After a certain delay from this word line turning on, the clock signal SAEN1 is switched on. The pre-amplifier includes the pair of cross-coupled NMOS transistors N1 and N2. Accordingly, the pre-amplifier cannot recover from an erroneous state once the data is latched. Thus, the pre-amplifier, including the NMOS transistors N1 and N2, is switched on when the word line is just about to be shut off in order to get the maximum available signal levels.

Once the pre-amplifier including the NMOS transistors N1 and N2 is on, the NMOS transistors N1 and N2 start to discharge the sense amplifier inputs SAIN and SAINB at different rates as a result of the small differential voltages. The rate of this discharging process is determined by the amount of current provided by the current source NC1. This current source NC1 is tunable by some test options. The stronger sense amplifier input splits are fed onto the gates of the differential repeater pair, including the NMOS transistors N3 and N4. The NMOS transistors N3 and N4 discharge to the output lines OUT and OUTB according to the differential voltages received by the NMOS transistors N3 and N4.

Then, the main sense-latch, including the PMOS transistors P3 and P4 and the NMOS transistors N5 and N6, is switched on by a small current source NC2. This current source NC2 is controlled by the clock signal SAEN2. This main sense-latch brings down the common node voltage even more and provides a smoother transition of the voltage levels at the output lines OUT and OUTB. The differential repeater pair, including the NMOS transistors N3 and N4, transfers the signals to the output lines OUTB and OUT, respectively, without too much amplification until the voltage at the output lines OUTB and OUT drops to the difference between the voltage Vdd and the threshold voltage Vtp (Vdd–Vtp).

The last stage of amplification comes into play after the voltages at the output lines OUT and OUTB split to a certain degree. Recall that these voltages at the output lines OUT and OUTB are differential because of the differential repeater pair, including the NMOS transistors N3 and N4. The stronger sense amplifier inputs SAIN and SAINB are split and fed onto the gates of the differential repeater pair, including the NMOS transistors N3 and N4. As stated above, the NMOS transistors N3 and N4 discharge to the output lines OUTB and OUT, respectively, according to the differential voltages received by the NMOS transistors N3 and N4. The clock signal SAEN3 turns on the strong current source NC3 and starts to quickly pull apart the output voltage levels at the output lines OUT and OUTB. The output data is sent to the drivers DR1 and DR2 and then stored in the latches L1 and L2. The current then dies away as the PMOS transistors P4 or P3 shut off, depending on which transistor was just on.

Soon after the clock signal SAEN3 is on, the PMOS transistors P1 and P2 are shut off. The PMOS transistors P1 and P2 isolate the sense amplifier inputs SAIN and SAINB from the input bit lines IN and INB. Accordingly, the input bit lines IN and INB can go back to pre-charge earlier without interfering with the sense amplifier operation. The equalizer SAINEQ starts the equalization because the output at the output lines OUT and OUTB have already been split rail to rail. The recovery time for the pre-amplifier is important in order to minimize the read cycle time. Any residual differential signal on the input lines SAIN and SAINB can cause delay in sensing timing and can even cause erroneous output.

Then, the clock SAEN1 shuts off to cut off the power of the differential repeater pair, including the NMOS transistors N3 and N4. Next, the pre-charge signal input PSAIN is opened to pre-charge the sense amplifier input lines SAIN and SAINB to the level of voltage Vdd by the PMOS transistors P1 and P2. Then, the clock signals SAEN2 and SAEN3 cut off the main sense-latch. The main sense-latch is then ready for another read operation.

Advantageously, the control signals of the dynamic sense amplifier 201 are generated by a self-timed pulse triggered by the clock signal SAEN1. This self-timed pulse acts in a chain reaction with the clock signals SAEN2 and SAEN3 and can minimize clock skew caused by different decoding paths. Such a 3-stage clock, including the clock signals SAEN1, SAEN2 and SAEN3, shuts off unnecessary currents and pre-charges the signal lines once the read operation is complete. The dynamic sense amplifier 201 minimizes the read cycle time and significantly reduces direct current power consumption to about zero. Thus, the dynamic sense amplifier 201 is beneficial for usage in wide parallel data output applications.

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than a restrictive sense.

What is claimed is:

1. A dynamic sense amplifier comprising:

a pre-amplifier configured to amplify small input signals according to a first clock signal; and a main sense-latch coupled to the pre-amplifier, wherein the main sense-latch is configured to respond to the small input signals according to a second clock signal and a third clock signal, and wherein the dynamic sense amplifier is configured to consume substantially zero direct current power.

2. The dynamic sense amplifier of claim 1, wherein the main sense-latch is configured to store a read data, wherein after the read data is stored in the main sense-latch, the pre-amplifier is configured to shut-off in preparation for a next read operation.

3. The dynamic sense amplifier of claim 1, wherein the sense amplifier is particularly suitable for static random access memory having a high-speed pipeline design.

4. The dynamic sense amplifier of claim 1, further comprising:

a first input line coupled to the pre-amplifier; and a second input line coupled to the pre-amplifier.

5. The dynamic sense amplifier of claim 4, wherein the pre-amplifier comprises:

a first NMOS transistor having a drain coupled to the first input line and a gate coupled to the second input line; and a second NMOS transistor cross-coupled to the first NMOS transistor, wherein the second NMOS transistor has a drain coupled to the second input line and a gate coupled to the first input line, wherein a source of the second NMOS transistor is coupled to a source of the first NMOS transistor.

6. The dynamic sense amplifier of claim 1, wherein the pre-amplifier is enabled when a first current source is turned on according to the first clock signal.

7. The dynamic sense amplifier of claim 5, further comprising a first pre-charger configured to pre-charge the first input line and the second input line, the first pre-charger comprising:

a first PMOS transistor having a drain coupled to a first bit line and a source coupled to the first input line; and a second PMOS transistor having a drain coupled to a second bit line and a source coupled to the second input line, wherein a gate of the second PMOS transistor is coupled to a gate of the first PMOS transistor.

8. The dynamic sense amplifier of claim 4, further comprising a first equalizer configured to couple the first input line to the second input line after a read operation is complete in order to substantially eliminate any voltage difference between the first input line and the second input line.

9. The dynamic sense amplifier of claim 7, wherein the dynamic sense amplifier does not use MOS devices as load devices, and wherein the dynamic sense amplifier is not configured to operate the first PMOS transistor and the second PMOS transistor in their saturation regions.

10. The dynamic sense amplifier of claim 9, wherein the dynamic sense amplifier operates under a power supply of 0.6 volts or less.

11. The dynamic sense amplifier of claim 7, further comprising:

a first output line coupled to the pre-amplifier; and a second output coupled to the pre-amplifier.

12. The dynamic sense amplifier of claim 11, further comprising a differential repeater pair comprising:

a third NMOS transistor having a gate coupled to the second input line and a drain coupled to the second output line, wherein the third NMOS transistor is configured to discharge its capacitance at a first rate; and a fourth NMOS transistor having a gate coupled to the first input line and a drain coupled to the first output line, wherein a source of the fourth NMOS transistor is coupled to a source of the third NMOS transistor, wherein the fourth NMOS transistor is configured to discharge its capacitance at a second rate different than the first rate.

13. The dynamic sense amplifier of claim 12, wherein the second rate is different than the first rate, causing a differential voltage to develop.

14. The dynamic sense amplifier of claim 12, wherein the main sense-latch comprises:

a third PMOS transistor;

a fourth PMOS transistor cross-coupled to the third PMOS transistor;

a fifth NMOS transistor cross-coupled to the fourth PMOS transistor; and a sixth NMOS transistor cross-coupled to the fifth NMOS transistor.

15. The dynamic sense amplifier of claim 14, wherein the fifth NMOS transistor and the sixth NMOS transistor each have a source coupled to a second current source and a third current source, and wherein the second current source is controlled by a second clock signal, and wherein the third current source is controlled by a third clock signal.

16. The dynamic sense amplifier of claim 15, wherein the third current source is configured to provide more current than the second current source in order to speed up splitting of the first output line and the second output line.

17. The dynamic sense amplifier of claim 14, further comprising a second pre-charger coupled to the first output line and the second output line, wherein the second pre-charger is configured to pre-charge the main sense latch.

18. The dynamic sense amplifier of claim 17, further comprising a second equalizer configured to couple the first output line to the second output line after a read operation in order to substantially eliminate any voltage difference between the first output line and the second output line.

19. A dynamic sense amplifier comprising:

a first pre-charger;

a first equalizer coupled to the first pre-charger;

a first pre-amplifier coupled to the first equalizer;

a second pre-charger coupled to the first pre-amplifier;

a second equalizer coupled to the second pre-charger; and a main sense-latch coupled to the second equalizer.

20. The dynamic sense amplifier of claim 19, wherein:

the first pre-charger is coupled to a first bit line, a second bit line, a first input line and a second input line;

the first equalizer is further coupled to the first input line and the second input line;

the first pre-amplifier is further coupled to the first input line, the second input line, a first output line and a second output line;

the second pre-charger is further coupled to the first output line and the second output line;

the second equalizer is further coupled to the first output line and the second output line; and the main sense-latch is further coupled to the first output line and the second output line.

21. The dynamic sense amplifier of claim 19, wherein the first equalizer and the second equalizer are configured to keep internal nodes of the dynamic sense amplifier pre-charged at a voltage level Vdd before the dynamic sense amplifier starts a read operation.

22. The dynamic sense amplifier of claim 21, wherein the first pre-charger is configured to provide a pre-charge to the first equalizer, and wherein the second pre-charger is configured to provide a pre-charge to the second equalizer.

23. The dynamic sense amplifier of claim 20, wherein when a read operation starts, the first equalizer is configured to turn off and the pre-amplifier is configured to slowly discharge one of the first bit line and the second bit line, and wherein the pre-charger behaves as a switch to conduct a slight differential voltage between the first input line and the second input line.

24. The dynamic sense amplifier of claim 20, further comprising a first current source coupled to the first pre-amplifier, wherein the first current source is configured to turn on according to a first clock, and wherein when the first current source turns on, the first pre-amplifier turns on and begins to discharge the first input line and the second input line at differential rates.

25. The dynamic sense amplifier of claim 24, further comprising a second current source coupled to the main sense latch, wherein the second current source is configured to turn on according to a second clock, and wherein the second current source is configured to turn on as the first pre-amplifier is discharging.

26. The dynamic sense amplifier of claim 25, further comprising a third current source coupled to the main sense latch, wherein the third current source is configured to turn on according to a third clock, and wherein the third current source is configured to turn on as the first pre-amplifier splits voltages of the first output line and the second output line.

27. The dynamic sense amplifier of claim 26, wherein the third current source is stronger than the second current source, and wherein after voltages of the first output line and the second output line split to a certain degree, the third current source is configured to quickly pull apart voltages of the first output line and the second output line.

28. The dynamic sense amplifier of claim 27, further comprising:

a driver set coupled to the first output line and the second output line, wherein the driver set is configured to receive output data from the main sense-latch; and a latch set coupled to the driver set, wherein the latch set is configured to store the output data.

29. A static random access memory comprising a dynamic sense amplifier, wherein the dynamic sense amplifier includes a pre-amplifier configured to amplify small input signals according to a first clock signal and a main sense-latch coupled to the pre-amplifier, wherein the main sense-latch is configured to respond to the small input signals according to a second clock signal and a third clock signal, wherein the dynamic sense amplifier is configured to consume substantially zero direct current power.

* * * * *